United States Patent
Okamura et al.

(10) Patent No.: US 6,258,495 B1
(45) Date of Patent: Jul. 10, 2001

(54) PROCESS FOR ALIGNING WORK AND MASK

(75) Inventors: Takehiko Okamura; Yukihiro Kanda, both of Chofu (JP)

(73) Assignee: ORC Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 09/394,041

(22) Filed: Sep. 13, 1999

(30) Foreign Application Priority Data

Sep. 14, 1998 (JP) .................................................. 10-259857
Sep. 18, 1998 (JP) .................................................. 10-265033
Sep. 18, 1998 (JP) .................................................. 10-265034

(51) Int. Cl.$^7$ ....................................................... G03F 9/00
(52) U.S. Cl. ................................... 430/22; 430/5; 430/30
(58) Field of Search ..................................... 430/5, 22, 30

*Primary Examiner*—Christopher G. Young
(74) *Attorney, Agent, or Firm*—Liniak, Berenato, Longacre & White

(57) ABSTRACT

A mechanism for aligning a work and a mask, which comprising a camera which picks up an image of a mask mark for aligning a mask having a pattern and an image of a work mark of a work, a control mechanism which recognizes, memorizes, and control the positions of both marks, and, a moving means for moving the work or the mask based on the control signal from the control mechanism to align the shear in the positions of both marks, and which aligns one mark within another mark of both marks, is disclosed. In the case where said one mark to be aligned cannot be recognized, the positions of both marks which have been recognized and memorized at the previous operation are used as pseudo standard, and the amount of the shear in the positions of both marks is carried out to operate the alignment.

5 Claims, 14 Drawing Sheets

Fig. 1A
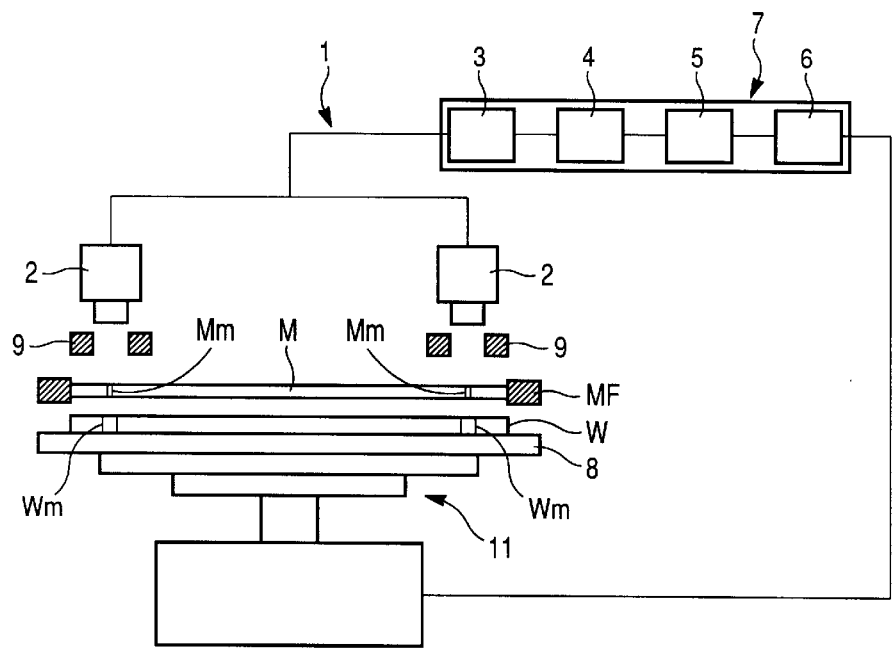
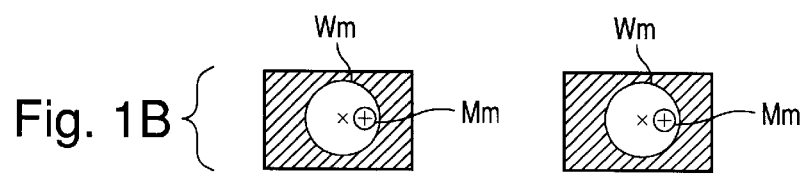
Fig. 1B
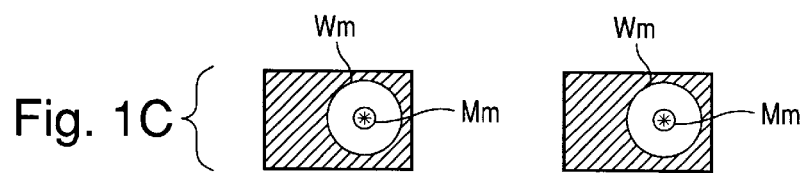
Fig. 1C
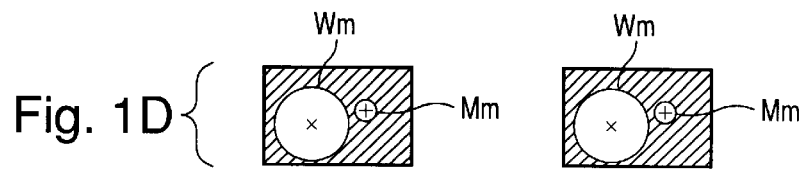
Fig. 1D
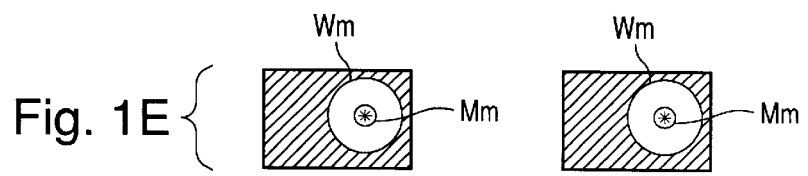
Fig. 1E

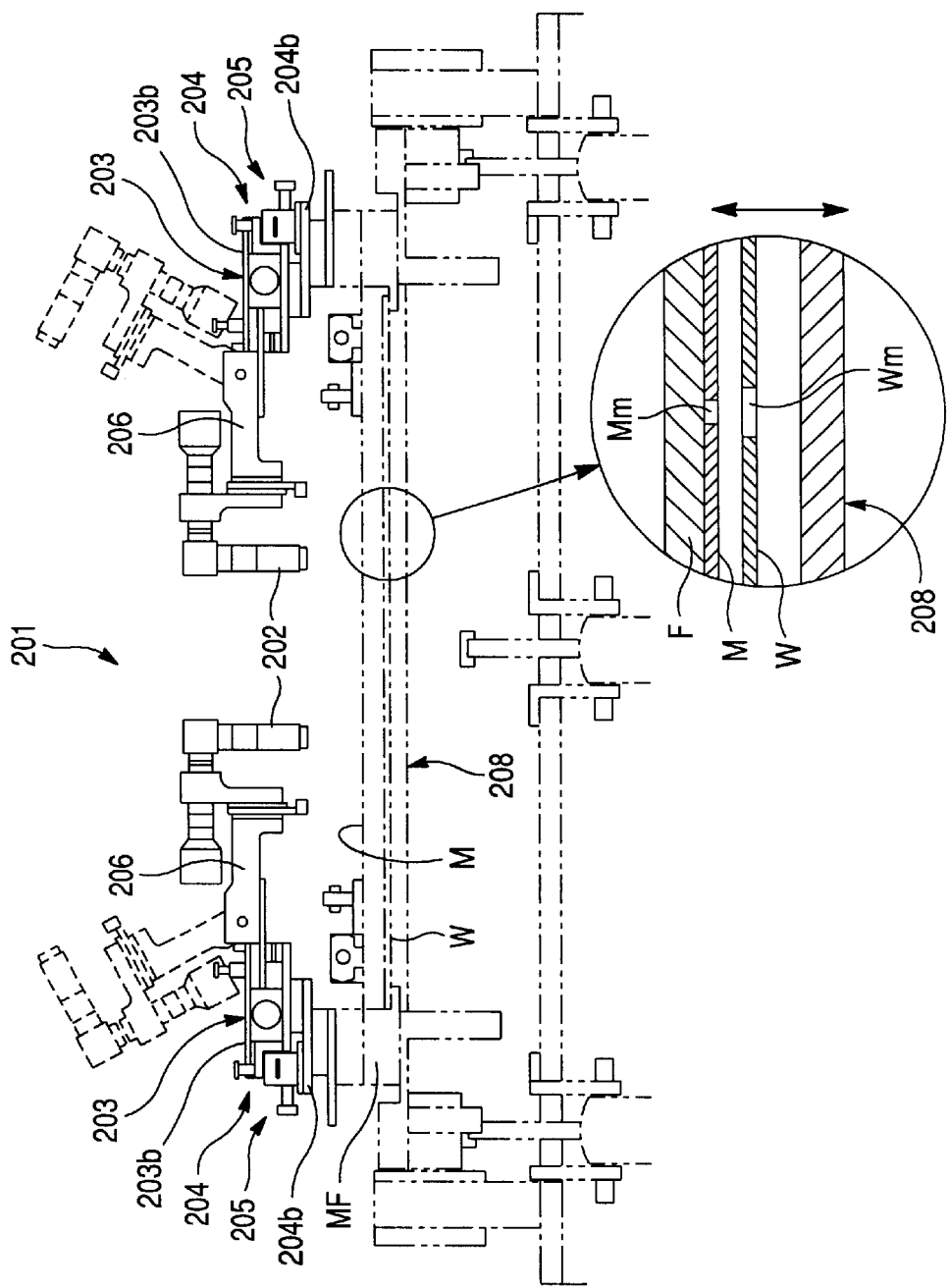

Fig. 12A
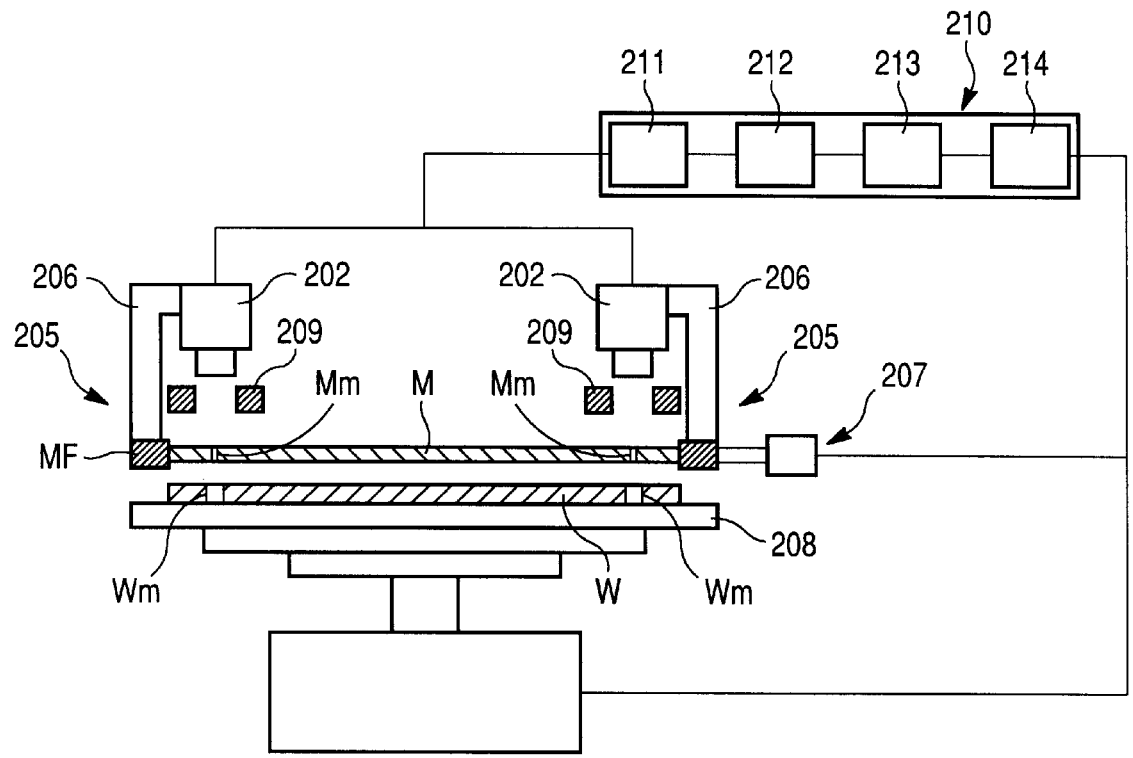
Fig. 12B { 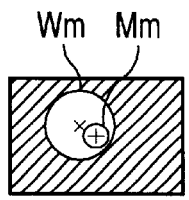 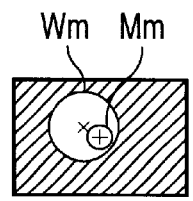 }
Fig. 12C { 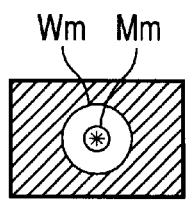 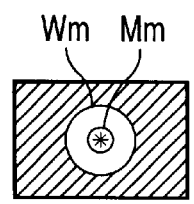 }

Fig. 14A
Prior Art
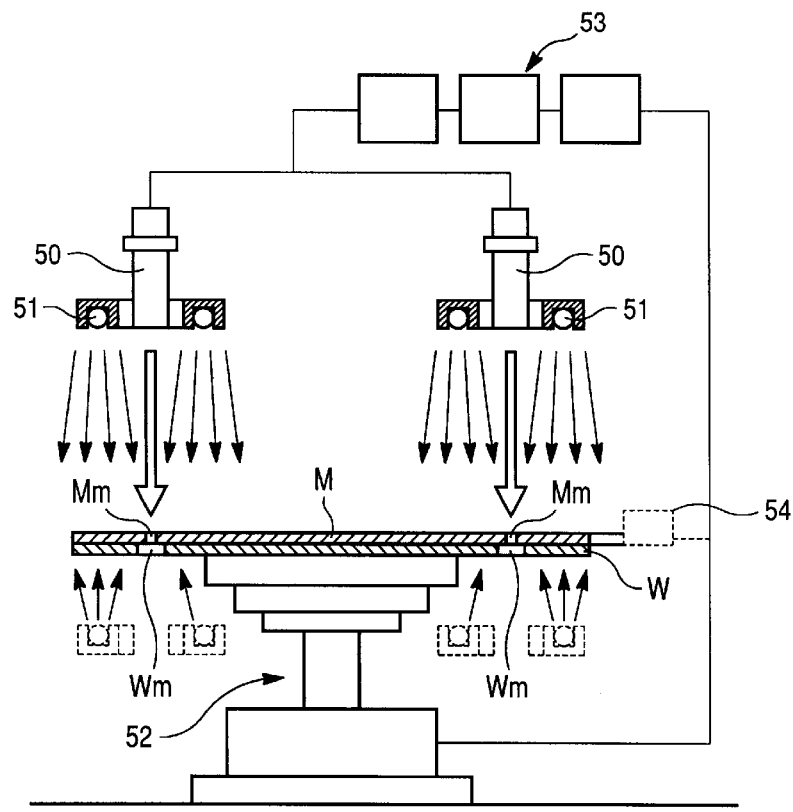
Fig. 14B
Prior Art
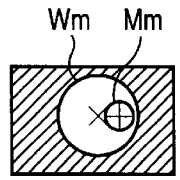 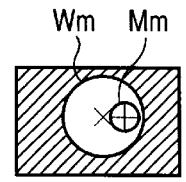
Fig. 14C
Prior Art
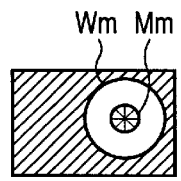 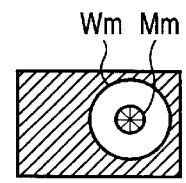
Fig. 14D
Prior Art
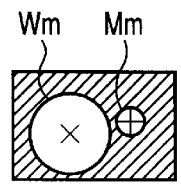 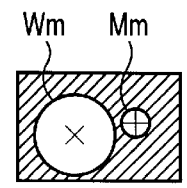

PROCESS FOR ALIGNING WORK AND MASK

FIELD OF THE INVENTION

The present invention relates to a mechanism and a process for aligning a work and a mask to the appropriate position. More particularly, the invention relates to a mechanism and a process for aligning a work and a mask to the appropriate position which can be operated even if the mark cannot be recognized in an appropriate manner, due to embedding one of the marks into another mark owing to the color around another mark, or due to overlapping one mark with the boundary of another mark.

BACKGROUND OF THE INVENTION

Conventionally, in the case of exposing a pattern of a mask to a work by means of a UV-irradiation apparatus, it is required to align the mask and the work to the appropriate exposure position. For this reason, various alignment processes have been suggested.

As shown in FIG. 14(a) and FIG. 14(b), in the case of aligning the work and the mask, the previous alignment which aligns the position of the work W placed on a work mounting plate 52 is carried out by using a previous alignment means (not shown) which is previously aligns the positions of the mask and the work W. Subsequently, the mask M placed on the upper side of the work mounting plate 52 or on any other portion is moved so that the work W and the mask M are placed in a face-to-face manner, and the work W and the mask M are come into contact with each other and adhered to each other by means of a vacuum suction mechanism (not shown).

When the work W the mask M are come into contact with each other and adhered to each other, the cameras such as CCD cameras are moved to the position to be picked up, pick up and recognize the work mark Wm (typically at least two marks) and mask mark Mm (typically at least two marks), and the amount of shear in the center positions of both marks Wm and Mm is calculated by a recognizing and calculating control means 53.

Furthermore, when being aligned, in the case where the work mounting plate 52 is an alignment mounting table which is movable, the situation of adhering the work W and the mask M is released, the alignment mounting table is controlled and moved by the control signal from the recognizing and calculating control means 53 on the basis of the calculated amount of shear in the positions to complete a series of the alignment operations.

In the case where the mask M is aligned by means of a three point locator shown by an ideal line (configured by pushing a frame for supporting the mask or edge surfaces of the three sides of the mask M by a pushing means), the adhering of the work W and the mask M is released, the mask M is controlled and moved by means 54 for moving the three point locator utilizing the control signal from the recognizing and calculating control means 53 on the basis of the calculated amount of shear in the positions to complete a series of the alignment operations. (see FIG. 14(c).

In order to carry out these alignment operation in an adequate manner, as shown in FIG. 14(b), it is required to recognize both marks Wm and Mm within the picked out display by the camera. In addition, in the case where the work mark Wm and the mask mark Mm can be picked up, these marks Wm and Mm are recognized by contrast (converted into binary data), the center positions of these marks Wm and Mm are calculated, and the amount of the shear in the positions of both marks Wm and Mm is calculated to find the amount of the work M or the mask M to be moved.

When the mask mark Mm and the work mark Mm are picked up by the camera 50, as shown in FIG. 14(a) by the real line, an illumination lamp 51 for picking up the image is placed on the side of the camera 50, and additionally utilizing the reflect light from the illumination lamp, the more vivid images are picked up. As shown in FIG. 14(a) by the ideal line, the illumination lamp 51 is placed opposite the camera 50, and a transmitting light is additionally utilized to pick up more vivid images. For this reason, the utilization of the reflect light or the transmitting light is changed according to the configuration of the apparatus.

However, the configuration of the conventional alignment mechanisms for aligning the work W and the mask M have the following problems.

When the alignment of the work W and the mask M is carried out, the operation of the aligning the work W and the mask M is carried out after the previous alignment of the work W has been finished. When the previous alignment of the work W is carried out, each of the edge surfaces of the work is pushed to carry out the previous alignment in the direction of the center of the work W.

For this reason, depending upon the configuration of the edges of the work, there is a situation that the work W is previously aligned at the position out of the predetermined position. In such a case, as shown in FIG. 14(d) when both marks Wm and Mm are picked up by a camera, the small black circular mask mark Mm is positioned except for inside of the large white circular work mark Wm. In this case, since color of the work W near the mask mark Mm is black as a rule, the black circular mask mark Mm is embedded on the color of the work W. For this reason, when being picked up by the camera, the mask mark Mm cannot be recognized, even if reflecting light or penetrating light is used as lighting.

Alternatively, depending upon the shape of the edge surface of the work W, there is a situation that the work W is previously aligned at the position out of the predetermined position. In such a case, as shown in FIG. 14(d), the mask mark Mm is sometimes positioned on the boarder line of the work mark Wm, when both marks Wm and Mm are picked up by the camera. In such a case, a recognition processing control means 53 cannot recognize the work mark Wm and the mask mark Mm in their normal shapes.

Consequently, if the mask mark Mm cannot be recognized by said image processing means 50, the previous alignment of the work W must be undone. This makes the series of operations such as vacuum depositing between the work W and the mask M, camera operation to carry out again, it is much time to carry out alignment, and there sometimes arises a situation where no appropriate operation can be carried out. In particular, in the case of an exposing apparatus, which is automatically run, the operations such as carrying in, transferring, aligning, exposing, and carrying out should be disadvantageously stopped.

In the conventional alignment means, since there is a configuration that the edge portion of the work W is pushed to conduct the previous alignment in the direction of the center of the work W.

SUMMARY OF THE INVENTION

The present invention has been made for solving the problems associated with the prior art. An object of the present invention is to provide a mechanism and a process for aligning a work and a mask which is adequately operable even if the work mark and the mask mark cannot be recognized at the same time, and which is also operable even without forming the mask mark or the work mark each in a large size.

Another object of the present invention is to provide a mechanism and a process for aligning a work and a mask which is adequately operable even if the work mark and the mask mark are overlapped so as not to recognize both marks, and which is operable without forming either or both of the marks in a form of having a large diameter.

Still another object of the present invention is to provide a mechanism and a process for aligning a work and a mask which can suppress the deformation of the lens for the camera inherent thereto as little as possible.

A first aspect of the present invention, which can attain these and other objects, relates to a mechanism for aligning a work and a mask, which comprises:

a camera which picks up an image of a mask mark for aligning a mask having a pattern and an image of a work mark of a work, a control mechanism which recognizes, memorizes, and control the positions of both marks, and, a moving means for moving the work or the mask based on the control signal from the control mechanism to align the shear in the positions of both marks, and which aligns one mark within another mark of both marks, wherein in the case where said one mark to be aligned cannot be recognized, the positions of both marks which have been recognized and memorized at the previous operation are used as pseudo standard, and the amount of the shear in the positions of both marks is carried out to operate the alignment.

The second aspect of the present invention concerns a process for aligning a work and a mask by placing a mask mark in the inside of a work mark to align an amount of the shear in the positions of the marks of the work and the mask, which comprises: a first step for picking up an image of the work mark and an image of a mask mark of the mask having a pattern and which is brought into contact with the work, a second step for calculating an amount of the shear in the position of both mask, and aligning the work and mask by a moving means to an appropriate exposure position based on the calculated amount of the shear in the positions of both mark, and a third step for memorizing the aligned position of the mask mark, said second step including: a basic step for calculating the amount of the shear in the positions of both marks and aligning both marks by moving the work and the mask, in the case where both marks can be recognized through the camera, and an applied step for calculating the amount of shear in the positions of both marks based on the position of the mask mark memorized in the previous operation as a pseudo standard, and aligning the work and the mask by moving them based on the amount of the shear calculated in the case where said one mark to be aligned cannot be recognized.

The third aspect of the present invention relates to a process for aligning a work and a mask by placing a work mark in the inside of a mask mark to align an amount of the shear in the positions of the work mark and the mask mark, which comprises: a first step for picking up an image of the work mark and an image of a mask mark of the mask having a pattern and which is brought into contact with the work, a second step for calculating an amount of the shear in the positions of both marks, and aligning the work and mask by a moving means to an appropriate exposure position based on the calculated amount of the shear in the both mark, and a third step for memorizing the aligned position of the work mark, said second step include: a basic step for calculating the amount of the shear in the positions of both marks and aligning both marks by moving the work and the mask, in the case where both marks can be recognized through the camera, and an applied step for calculating the amount of shear in both marks based on the position of the work mark memorized in the previous operation as a pseudo standard, and aligning the work and the mask by moving them based on the amount of the shear calculated, in the case where said one mark to be aligned cannot be recognized.

The fourth aspect of the present invention relates to a mechanism for aligning a work and a mask, which comprises: a camera which picks up an image of a mask mark for aligning a mask and an image of a work mark of a work, a control mechanism which recognizes, memorizes, and control the positions of both marks and calculates, and, a moving means for moving the work or the mask based on the control signal from the control mechanism to align the shear in both marks, and which aligns one mark within another mark of both marks, the mechanism further including: in the case where both marks picked up by the camera cannot recognized appropriately due to the overlapping one mark with the boundary of another mark, specifying said shape of said another mark from the shape of the recognizable part, recognizing another mark separating from said one mark along the boundary of said another mark, aligning said another mark and the sectioned shape of said one mark sectioned by the boundary formed inside of said another mark, and calculating an amount of the shear in the positions and operating the alignment of both marks.

The fifth aspect of the present invention relates to a process for aligning a work mark and a mask mark by placing one of both marks within another mark to align an amount of a shear in the positions, which comprises: a first step, in the case where both marks picked up by the camera cannot be recognized appropriately due to the overlapping one mark with the boundary of another mark by means of the alignment mechanism, for calculating a circumscribed rectangle of another mark from the part of another mark which can be recognized, a second step for calculating and recognizing an inscribed circle which inscribes said circumscribed rectangle, a third step for calculating a center position of said inscribed circle and an amount of the shear of the position with the center of the sectioned shape of said one mark sectioned by the boundary of said inscribed circle, a fourth step for operating the alignment based on the calculated amount of the shear in the position with the center of the sectioned shape of said one mark, and a fifth step for recognizing both marks, and calculating an amount of the shear in the center positions of both marks to operate the alignment.

A sixth aspect of the present invention relates to a process for aligning a work mark and a mask mark by placing one of both marks within another mark to align an amount of a shear in the positions, which comprises: a first step, in the case where both marks picked up by the camera cannot be recognized appropriately due to the overlapping one mark with the boundary of another mark by means of the alignment mechanism, for finding apex coordinating residing at the diagonal line of the circumscribed rectangle based on preset coordinating from the portion which can be recognized, a second step for finding a center position ($X_O$, $Y_O$) of an inscribed circle which inscribes said circumscribed rectangle from the following equations:

$$X_0=(X_1+X_2)/2 \quad (1)$$

$$Y_0=(Y_1+Y_2)/2 \quad (2),$$

and also finding the radius R of said inscribed circle from the following equation to recognize said inscribed circle:

$$R=\{(X_2-X_1+1)+(Y_2-Y_1+1)\}/4 \quad (3)$$

a third step for calculating a center position of said inscribed circle and an amount of the shear in the position with the center of the sectioned shape of said one mark sectioned by the boundary of said inscribed circle, a fourth step for operating the alignment based on the calculated amount of the shear in the position with the center of the sectioned shape of said one mark, and a fifth step for recognizing both marks, and calculating an amount of the shear in the center positions of both marks to operate the alignment.

The seventh aspect of the present invention relates to a process for aligning a work mark and a mask mark by placing one of both marks within another mark to align an amount of a shear in the position, which comprises: a first step for picking up a work mark of the mark placed on a mounting table and a mask mark of the mask, and recognizing the positions of both marks by a control mechanism, a second step for calculating the shear in the positions of both marks and aligning the work and mask by a moving means to an appropriate exposure position based on the calculated amount of the shear in the both mark, said second step including in the case where both marks cannot be recognized appropriately by means of said control mechanism, an applied step for calculating a circumscribed rectangle which circumscribes one mark from the shape of the part which can be recognized, and an inscribed circle thereof which is recognized as the mark, aligning the center of said one mark to the center position of a sectioned shape of the another mark sectioned by the boundary of said one mark, subsequently, recognizing both marks and aligning both marks based on an amount of a shear in the positions calculated from the center positions of both marks.

The eighth aspect of the present invention relates to a mechanism for aligning a work and a mask which comprises: a camera for picking up an image of a mask mark for alignment of the mask having a pattern and an image of a work mark of the work, a control means for recognizing, calculating, and memorizing the positions of both marks picked up by said camera; and a moving means for aligning the shear in the positions of both marks by a control signal from said control means; the camera being provided on the side of a supporting base which support said mask or said work via a moving mechanism.

The ninth aspect of the present invention relates to a mechanism for aligning a work and a mask which comprises: a camera for picking up an image of a mask mark for alignment of the mask having a pattern and an image of a work mark of the work, a control means for recognizing, calculating, and memorizing the positions of both marks picked up by said camera; and a transferring means for aligning the shear in the positions of both marks by a control signal from said control means; the camera being provided on the mask supporting frame on the supporting base side via a moving mechanism.

In the above aspect, it is preferable that the moving mechanism has a moving standard position at the position where the center position of one of the work and mask marks placed inside of another mark is aligned to the focus of the lens of the camera means.

More preferably, the moving mechanism has a moving standard position at the position where the center position of mask mark is aligned to the focus of the lens of the camera means.

BRIEF DESCRIPTION OF THE DRAWINGS

FIG. 1(a) is a principal drawing totally showing one embodiment of the alignment mechanism according to one embodiment of the present invention.

FIG. 1(b) is a plane view showing the situation where a mask mark and a work mark are picked out by a camera.

FIG. 1(c) is a plane view showing the situation where the mask mark and the work mark are aligned.

FIG. 1(d) is plane view showing the situation where a mask mark and a work mark are picked out by a camera.

FIG. 1(e) is a plane view showing the situation where the mask mark and the work mark are aligned.

FIG. 11 is a plane view showing the main portions of the alignment mechanism according to still another embodiment of the present invention.

FIG. 12(a) is a principal drawing totally showing the alignment mechanism according to still another embodiment of the present invention.

FIG. 12(b) and FIG. 12(c) are plane views each showing the situation where another shape of the work mark and another shape of the mask mark are picked up by the camera.

FIG. 14(a) is a principal drawing totally showing the conventional alignment mechanism.

FIG. 14(b) is a plane view showing the situation where a mask mark and a work mark are picked out by a camera according to the conventional alignment mechanism.

FIG. 14(c) is a plane view showing the situation where the mask mark and the work mark are aligned according to the conventional alignment mechanism.

FIG. 14(d) is plane view showing the situation where a mask mark and a work mark are picked out by a camera according to the conventional alignment mechanism.

DESCRIPTION OF THE PREFERRED EMBODIMENTS

Figure 2A:
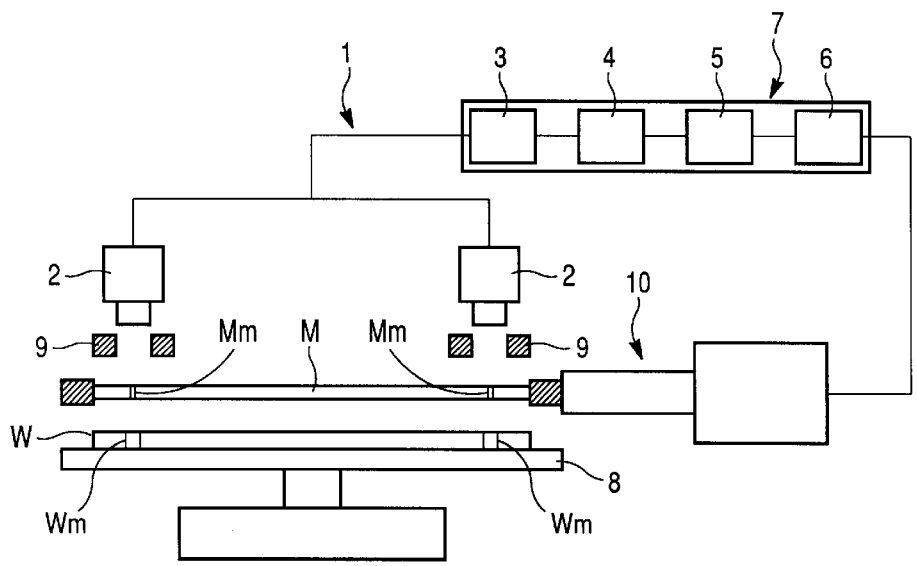
FIG. 2(a) is a principal drawing totally showing one embodiment of the alignment mechanism according to the first aspect of the present invention.

A first embodiment of the present invention will now be described by referring to the drawings.

Figure 2B:
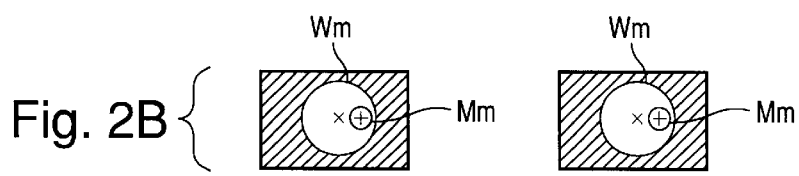
FIG. 2(b) is a plane view showing the situation where a mask mark and a work mark are picked out by a camera.
Figure 2C:
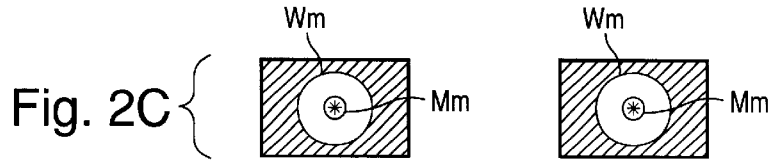
FIG. 2(c) is a plane view showing the situation where the mask mark and the work mark are aligned.
Figure 2D:
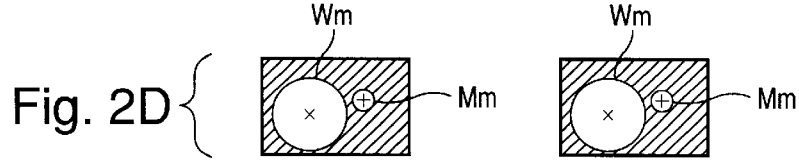
FIG. 2(d) is plane view showing the situation where a mask mark and a work mark are picked out by a camera.
Figure 2E:
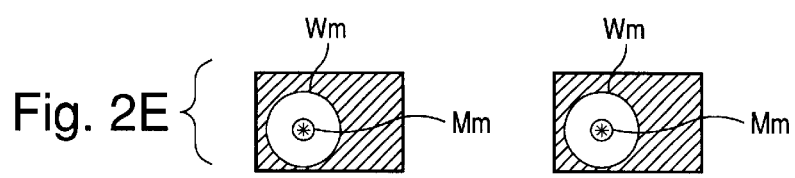
FIG. 2(e) is a plane view showing the situation where the mask mark and the work mark are aligned.
Figure 3:
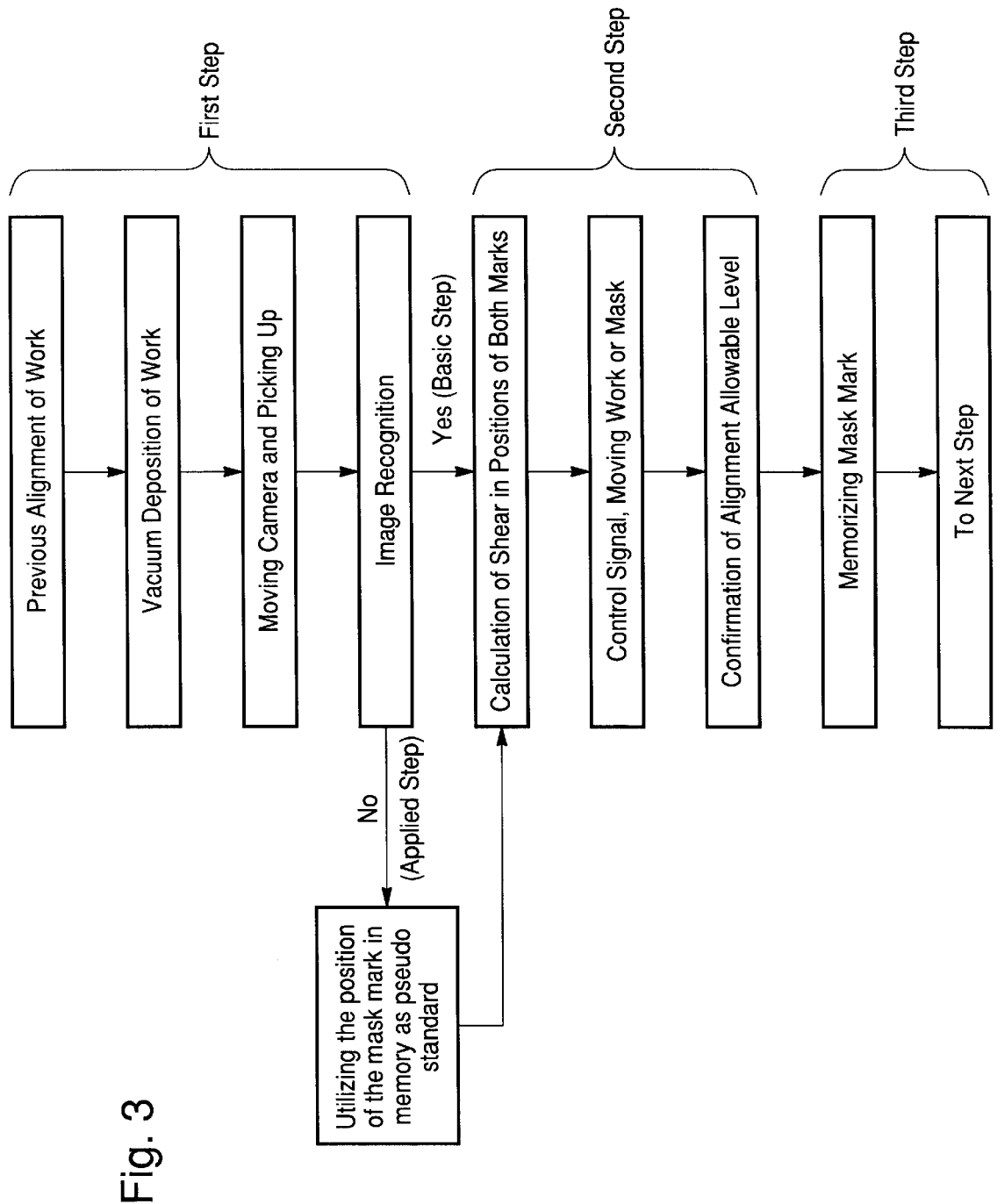
FIG. 3 is a block diagram showing the operation steps of the alignment mechanism according to one embodiment of the present invention.

FIG. 1(a) is a principal drawing totally showing one embodiment of the alignment mechanism according to one embodiment of the present invention. FIG. 1(b) is a plane view showing the situation where a mask mark and a work mark are picked out by a camera. FIG. 1(c) is a plane view showing the situation where the mask mark and the work mark are aligned. FIG. 1(d) is plane view showing the situation where a mask mark and a work mark are picked out by a camera. FIG. 1(e) is a plane view showing the situation where the mask mark and the work mark are aligned. FIG. 2(a) is a principal drawing totally showing one embodiment of the alignment mechanism according to the first aspect of the present invention, and FIG. 2(b) is a plane view showing the situation where a mask mark and a work mark are picked out by a camera. FIG. 2(c) is a plane view showing the situation where the mask mark and the work mark are aligned. FIG. 2(d) is plane view showing the situation where a mask mark and a work mark are picked out by a camera. FIG. 2(e) is a plane view showing the situation where the mask mark and the work mark are aligned. FIG. 3 is a block diagram showing the operation steps of the alignment mechanism according to one embodiment of the present invention. FIG. 4 is a principal drawing of a light exposure apparatus showing the arrangement of the alignment mechanism according to one aspect of the present invention. FIG. 5(a) is a plane view showing the situation where another shapes of work mark and mask marl are picked up by the camera. FIG. 5(b) is a plane view showing the situation where still another shapes of work mark and mask marl are picked up by the camera.

As shown in FIG. 1(a), an alignment mechanism 1 is composed of a mounting table 8, which mounts a work W, a supporting frame MF, which supports a mask M, cameras 2 and 2, typically CCD cameras, which pick up a mask mark Mm of the mask M and a work mark Wm of the work W. illumination lamps 9 and 9 for illuminating the picked up images, and a control mechanism 7, which recognizes, calculates and memorizes the images picked up by the cameras 2 and 2, and which moves the side of the mounting table 8 based on the results of the calculation. The mask M possesses a prescribed pattern, for example, a circuit pattern in the case where the work W is a printed board. A mounting table 8 adheres and holds the work W at the mounting position.

The control mechanism 7 has a central processing unit 3, which recognizes the images picked up by the cameras 2 and 2 and calculates them according to a prescribed calculation, a ROM 4, which memorizes the calculation programs making a calculation in the central processing unit, a RAM 5 having functions such as storing the results of the calculation calculated by the central processing unit 3, and input and output data, as well as reading data and programs, and optionally an external storage device 6.

When being transferred to the mounting table 8 by means of a transferring means such as a handler (not shown), the work W is previously aligned by pushing the edge surfaces by means of a previous alignment mechanism (see FIG. 4) for the first time. After the previous alignment of the work W has been completed, the mounting table 8 ascends to allow the mask M to bring into contact with the work M and, at the same time, by means of a vacuum adhering means (not shown), the mask M and work W are in contact with each other. In this state, the cameras 2 and 2 are moved to the positions to be picked up by means of a driving portion (not shown), and then the positions of the work mark Wm of the work W and the mask mark Mm of the mask M are picked up.

As shown in FIG. 1(b) and FIG. 3, in the case where the mask mark Mm is placed inside of the work mark Wm (basic step), the center positions of both marks are calculated by the control mechanism 7, and on the basis of the amount of the shear in the position, the distance of the work W to be moved is calculated. Then, the vacuum adhering between the mask and the work W is released, the mounting table 8 actuates, and an alignment driving mechanism 11 (X, Y, θ driving) serving as means for transferring the mounting plate is driven on the basis of the control signal output form the control mechanism 7. This moves the work W to the position appropriate for exposure as shown in FIG. 1(c) to complete the alignment operation. At this time, the position of the mask mark Mm should be memorized by memorizing means at the control mechanism side (either or both of the RAM 5 and storage device 6).

As shown in FIG. 1(d) and FIG. 3, in the case where the mask mark Mm is positioned out of the work mark Wm (applied step), the mask mark Mm cannot be recognized even when it is picked up by the cameras 2 and 2, due to the obstruction of the color (typically black) at the side of the work W. In this case, utilizing the position of the mask mark Mm, which has been memorized in the previous operation as a pseudo standard for calculating the position, the amount of the shear in the positions between both marks Wm and Mm can be calculated. The term "previous operation" used herein means the alignment operation of the mask mark, which has just carried out. As for the precision of the position of the mask mark Mm, even if the mechanism for transferring the mask is configured due to the vertical movement of the supporting frame MF or is configured that the supporting frame MF is moved from any other position, such a configuration can keep very good precision due to the predetermined repetition. For this reason, the precision may be assumed to be stable.

Consequently, even if the mask mark Mm cannot be recognized by the camera due to the mask mark Mm placed out of the prescribed position in the course of the previous alignment, as shown in FIG. 1(e), it is possible to carry out the alignment operation without returning the work W to the operation side of the previous alignment or without stopping the operation. After the alignment has been completed, a confirmation operation whether the positions of both marks are within the allowable level or not is confirmed. In the case where the work W should be further moved, the control signal calculated on the basis of the amount of the shear in the positions is transferred to the side of the mounting table 8 to carry out the alignment operation.

Figure 4A:
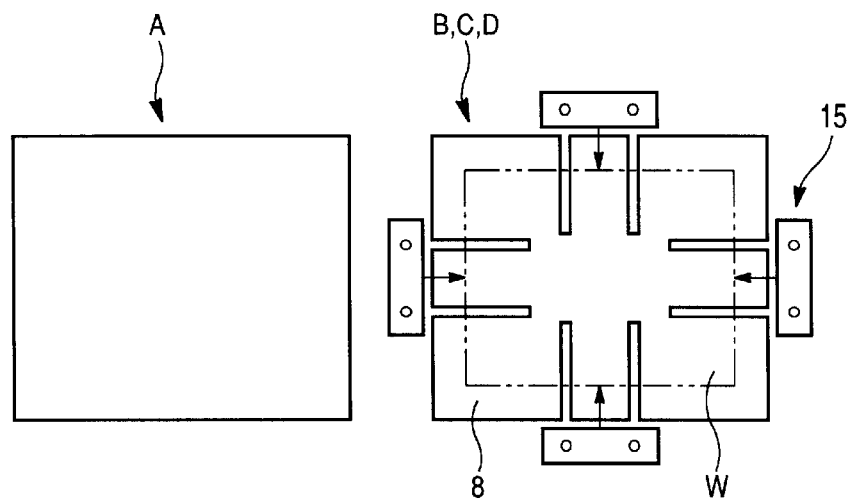
FIG. 4 is a principal drawing of a light exposure apparatus showing the arrangement of the alignment mechanism according to one aspect of the present invention.
Figure 4B:
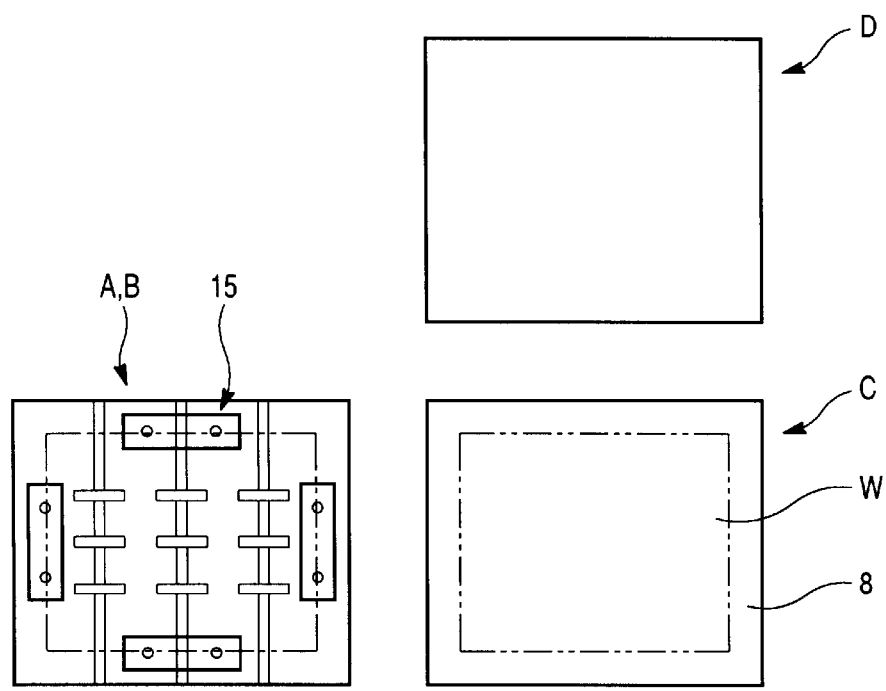
Figure 5A:
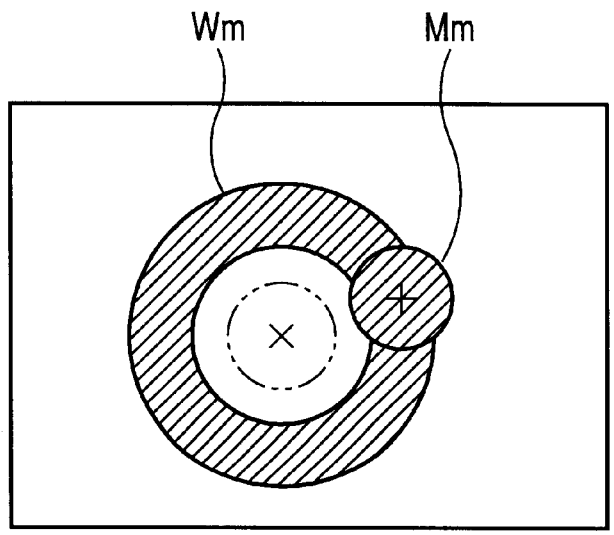
FIG. 5(a) is a plane view showing the situation where another shapes of work mark and mask marl are picked up by the camera.
Figure 5B:
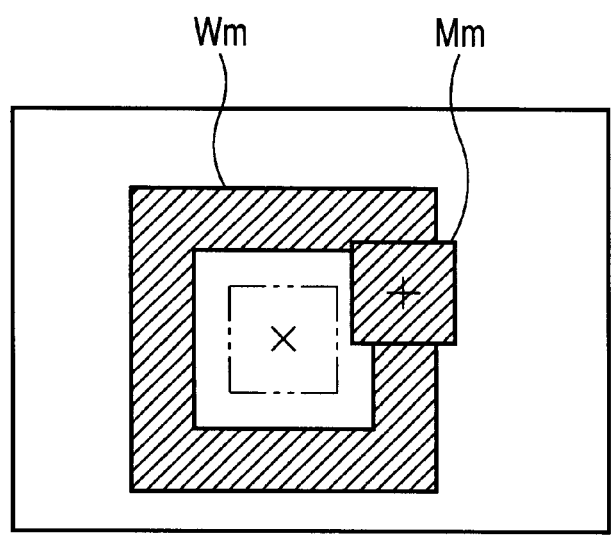
FIG. 5(b) is a plane view showing the situation where still another shapes of work mark and mask marl are picked up by the camera.

As shown in FIG. 4(a) and FIG. 4(b), the alignment mechanism 1 is placed as an aligning stage C at the position same as the that of the previously aligning stage B or is placed at the position different from the previously aligning stage B. In any cases, an adequate alignment operation can be carried out by the application of the operation described above, even if the mask mark Mm cannot be recognized by the color of the work W.

The configurations other than described above will now be described by referring to FIG. 2 and FIG. 3. The same numbers are applied to the same portions, and the same portions. are not described repeatedly.

The alignment mechanism 1 shown in FIG. 2(a) has a configuration where the position of the mask M is moved by the moving mechanism 10, and the work W placed on the mounting table 8 is vertically moved.

Consequently, after the operation of the previous alignment has been completed, and the mounting plate 8 ascends, the work W is in contact with the mask M to become the situation of vacuum adhering to the mask M. The cameras 2 and 2 are moved by the driving portion (not shown) to the positions to be picked up, and then pick up the images of both marks Wm and Mm. The mounting plate 8 adheres and holds the work at the mounting position.

As shown in FIG. 2(b), in the case where the mask mark Mm of the mask is positioned inside of the work mark Wm of the work within the display of the picked up images (basic step), the amount of the shear in the positions of both marks Wm and Mm is calculated by the control mechanism. Then, when the vacuum adhering between the mask and the work W is released, and the mounting table 8 descends, the cameras 2 and 2 are moved to the positions to be picked out, and by the control signal output form the control mechanism 7, the moving means 10 is controlled to move the mask M to carry out the alignment. At this time, the position of the mask mark Mm after the movement (FIG. 2(c)) should be memorized by memorizing means at the control mechanism side (either or both of the RAM 5 and storage device 6).

As shown in FIG. 2(d), in the case where the mask mark Mm of the mask is positioned outside of the work mark Wm of the work within the display of the picked up images (applied step), the mask mark Mm when being picked up by the camera 2 and 2 cannot be recognized due to the obstruction of the color or shade of the work W. In this case, utilizing the position of the mask mark Mm, which has been memorized in the previous operation as a pseudo standard for calculating the position, the amount of the shear in the positions between both marks Wm and Mm is calculated to transfer the control signal to the side of the moving means 10, whereby the position of the mask is moved to align both marks Wm and Mm as shown in FIG. 2(e).

In the case where the alignment operation of the mask mark Mm is carried out from the position shown in FIG. 2(d) to the aligned position shown in FIG. 2(e), if the mask mark cannot be aligned within the allowable level by one control signal transferred from the control mechanism 7, two or more alignment operations should be repeatedly carried out.

In the case where the shape of the work mark Wm is circular, as shown in FIG. 5(a), or the shape of the work mark Wm is polygon as shown in FIG. 5(b), the mask mark is a rectangle, and the mask mark Mm is hide on the side of the work W, so the mask mark Mm cannot be picked up, the amount of the shear in the positions can be calculated using the position of the mask mark Mm, which has been memorized at the previous operation as a pseudo standard. For this reason, even in such a case, the alignment operation can be adequately carried out.

While a light exposure apparatus, etc. is composed of a transferring stage A, a previous alignment stage B provided separately from the transferring stage A, an alignment stage C, and an exposure stage D as shown in FIG. 4(a), or is composed of a transferring stage A, a previous alignment stage B placed at the same position as that of the transferring stage A, and an alignment stage C, which is separately placed, and an exposure stage D which is separately placed, as shown in FIG. 4(b), the alignment mechanism 1 of the present invention can be used as the alignment stage C (see FIG. 1 and FIG. 2). The alignment operation can be carried out even if the illumination lamp used is a reflecting light or a transmitting light.

Furthermore, while the embodiment that the work and mask are picked up by the cameras in the situation they are in contact with and adhered to each other has been described, it is of course possible that the work and the mask can be picked up in the state that they are nearly contacted, and then the alignment operation is carried out.

Also, while the work is exemplified as a printed board, works having different application can be applied to the embodiment, as long as they should be aligned, examples including semiconductor wafer, liquid crystal board, flexible printed circuit board, and other sheet and roll to roll type. The mask may be one which are used in the alignment such as a mask film, glass substrate and the like.

As an example that any mark cannot be recognized after being picked up by the camera, the situation where the mask mark is positioned out of the work mark, it is also the case that the mask mark cannot be recognized because the mask mark is overlapped with the boundary of the work mark. Consequently, such a case can be availably applied to the present invention.

Furthermore, while the operation direction shown in the drawings is plane, the alignment operation of the present invention can be carried out even in the cases where either or both surface of the work is aligned, where the alignment operation is carried out in a vertical direction, and where the alignment operation is carried out in a slanted state.

Also, while the embodiment of the present invention that the mask mark is aligned inside of the work mark has been described, the embodiment that the work mark is aligned inside of the mask mark, the embodiment that the alignment operation is carried out in a similar manner in the state where the work and the mask are replaced with each other are also within the scope of the present invention.

As described above, the present invention has the following advantages:

By carrying out the previous alignment, the amount of the shear in the positions of the work mark and the mask mark can be carried out utilizing the position of the mask mark (or work mark) which has been memorized in the previous operation as a pseudo standard, even when the mask mark (or work mark) is positioned outside of the work mark (or mask mark). Accordingly, the alignment operation can be carried out in a reliable manner without any trouble.

The amount of the shear in the positions of both marks can be calculated utilizing the position of the mask mark which has been memorized in the previous operation as a pseudo standard, even if the mask mark picked up by the camera cannot be recognized due to the objection by the color of the work in the case where the mask mark is aligned inside of the work mark.

Accordingly, on the basis of the calculated amount of the shear in the positions, the alignment in which the work or the mask is moved by the moving means can be availably carried out.

Furthermore, in spite of the shape of the mark, i.e., in the case where either or both of the mask mark and the work mark have a shape like a circle, even if the mask mark or the work mark cannot be recognized, the amount of shear in the positions can be advantageously calculated utilizing the position of the mask mark or work mark, which has been memorized in the previous operation as a pseudo standard.

In the case of carrying out the aligning operation utilizing the position of the mask mark or work mark, which has been memorized in the previous operation as a pseudo standard, it is also possible that several moving operations can be carried out until the marks are aligned within an allowable level, making it possible to securely align both marks.

A second embodiment of the present invention will now be described with referring to the drawings.

Figure 6A:
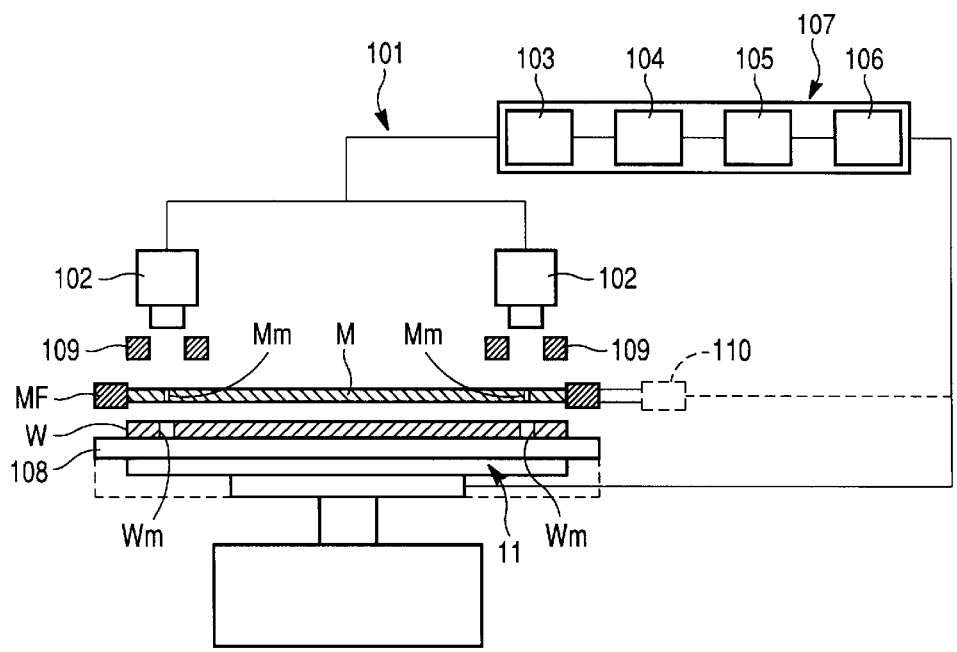
FIG. 6(a) a principal drawing totally showing one embodiment of the alignment mechanism according to another embodiment of the present invention.
Figure 6B:
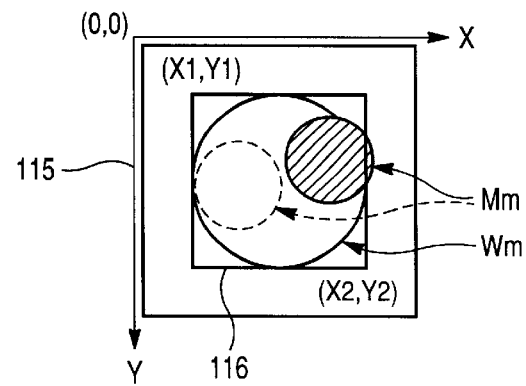
FIG. 6(b) is a plane view showing the situation where a circumscribed rectangle, which circumscribes the mask mark is calculated from a shape of the work mark which can be recognized.
Figure 6C:
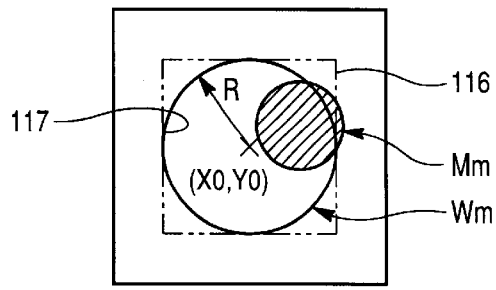
FIG. 6(c) is a plane view showing the situation where the center position and radius of the inscribed circle, which inscribes the circumscribed rectangle, are calculated.
Figure 7A:
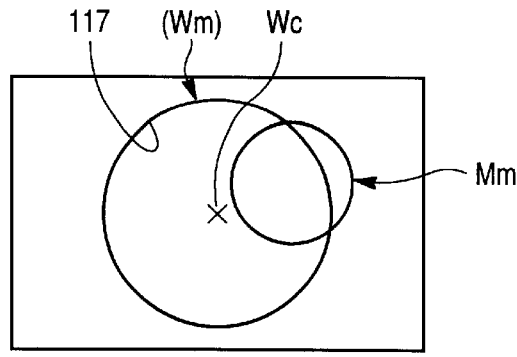
FIG. 7(a) is a plane view showing the situation where the inscribed circle is recognized as the work mark and the mask mark.
Figure 7B:
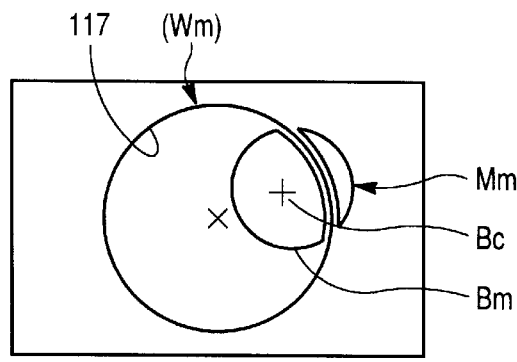
FIG. 7(b) is a plane view showing the situation where the mask mark is sectioned by the boundary of the work mark.
Figure 7C:
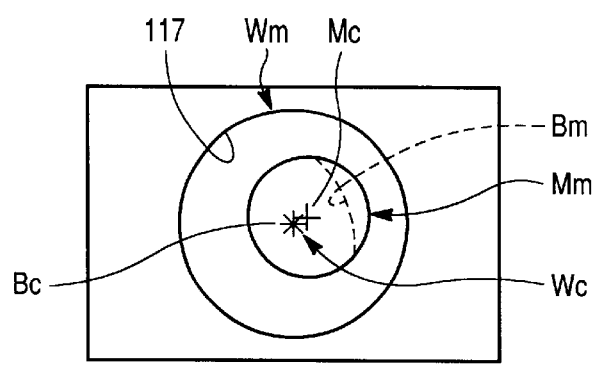
FIG. 7(c) is a plane view showing the situation where the center position of the work mark and the center position of the sectioned shape of the mask mark, which has been sectioned, are aligned.
Figure 7D:
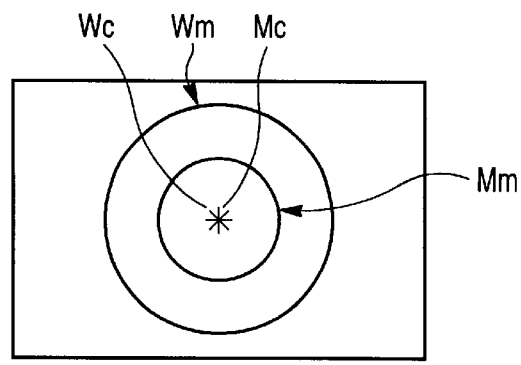
FIG. 7(d) is a plane view showing the situation where the work mark and the mask mark are aligned.
Figure 8:
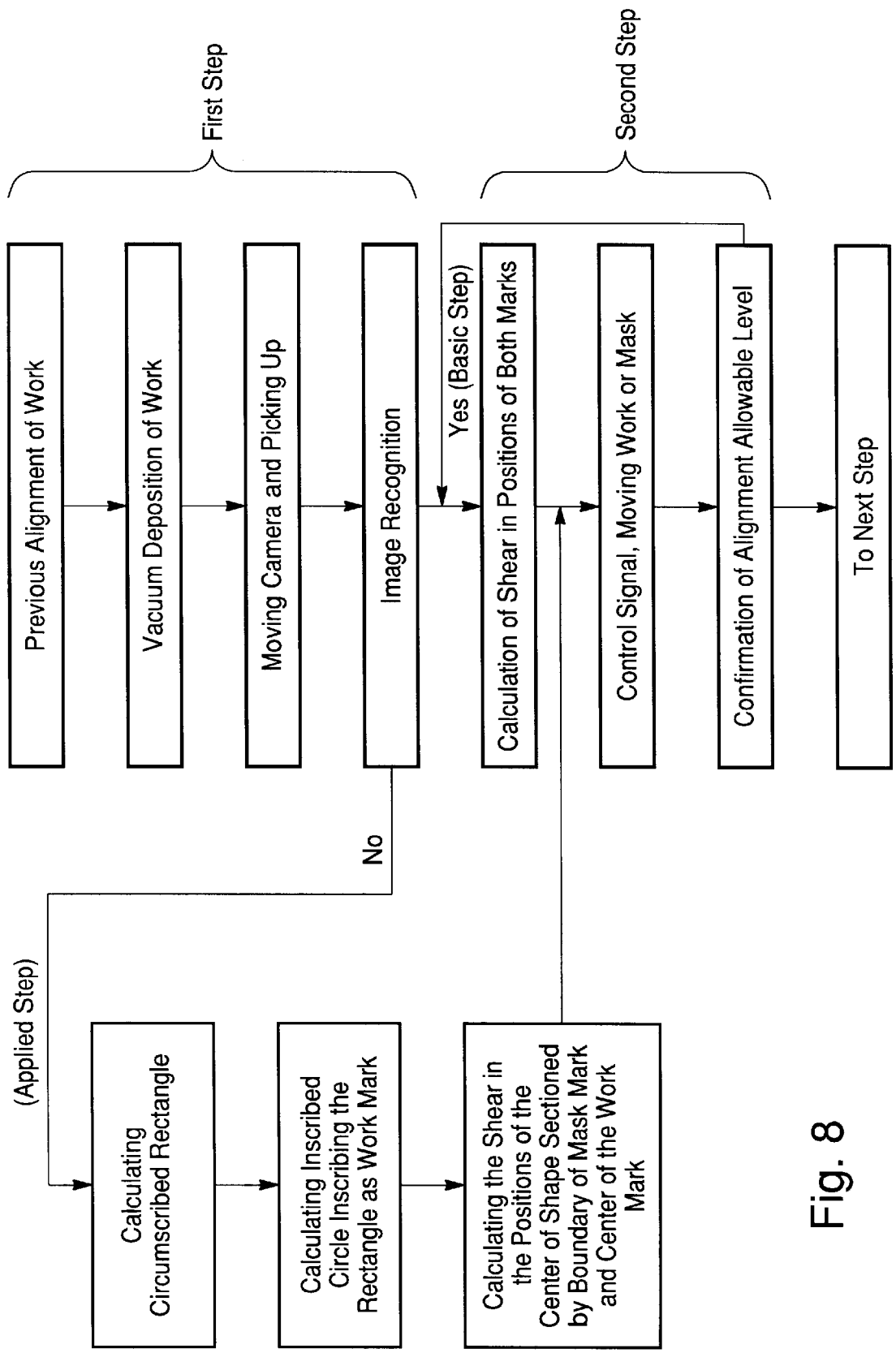
FIG. 8 is a block diagram showing the operation steps of the alignment mechanism according to one embodiment of the present invention.
Figure 9A:
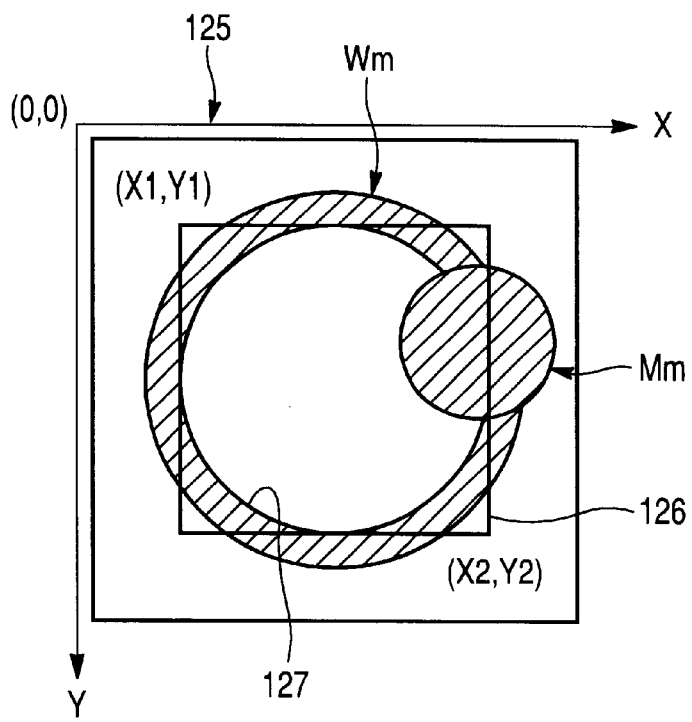
FIG. 9(a) and FIG. 9(b) are plane views each showing the situation where another shape of the work mark and another shape of the mask mark are picked up by the camera.
Figure 9B:
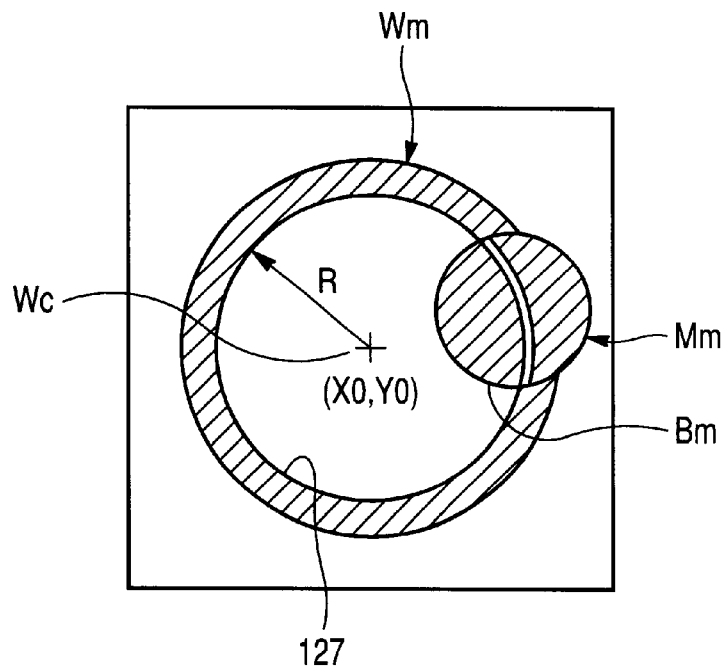

FIG. 6(a) a principal drawing totally showing one embodiment of the alignment mechanism according to another embodiment of the present invention, FIG. 6(b) is a plane view showing the situation where a circumscribed rectangle, which circumscribes the mask mark is calculated from a shape of the work mark which can be recognized. FIG. 6(c) is a plane view showing the situation where the center position and radius of the inscribed circle, which inscribes the circumscribed rectangle, are calculated. FIG. 7(a) is a plane view showing the situation where the inscribed circle is recognized as the work mark and the mask mark. FIG. 7(b) is a plane view showing the situation where the mask mark is sectioned by the boundary of the work mark. FIG. 7(c) is a plane view showing the situation where the center position of the work mark and the center position of the sectioned shape of the mask mark, which has been sectioned, are aligned. FIG. 7(d) is a plane view showing the situation where the work mark and the mask mark are aligned. FIG. 8 is a block diagram showing the operation steps of the alignment mechanism according to one embodiment of the present invention. FIG. 9(a) and FIG. 9(b) are plane views each showing the situation where another shape of the work mark and another shape of the mask mark are picked up by the camera.

As shown in FIG. 6(a), the alignment mechanism 101 is composed of a mounting table 108, which mounts the work W, a supporting frame MF, which pick up a mask mark Mm of the mask M and a work mark Wm of the work W, cameras 102, typically CCD cameras, which pick up a mask mark Mm of the mask M and a work mark Wm of the work W, illumination lamps 9 for illuminating the picked up images, a control mechanism 107, which recognizes, calculates and memorizes the images picked up by the cameras 102, and which moves the side of the mounting table 108 based on the results of the calculation, and a moving mechanism 111 (shown as a real line) such as an alignment driving mechanism, which moves the work W on the basis of the control signal from the control mechanism 107. The mask M possesses a prescribed pattern, for example, a circuit pattern in the case where the work W is a printed board. A mounting table 108 adheres and holds the work W at the mounting position.

The control mechanism 107 has a central processing unit 103, which recognizes the images picked up by the cameras 102 and calculates them according to a prescribed calculation, a ROM 104, which memorizes the calculation programs making a calculation in the central processing unit, a RAM 105 having functions such as storing the results of the calculation calculated by the central processing unit 103, and input and output data, as well as reading data and programs, and optionally an external storage device 106.

When being transferred to the mounting table 108 by means of a transferring means such as a handler (not shown), the work W is previously aligned by pushing the edge surfaces by means of a previous alignment mechanism (not shown) for the first time. After the previous alignment of the work W has been completed, the mounting table 108 ascends to allow the mask M to bring into contact with the work M and, at the same time, by means of a vacuum adhering means (not shown), the mask M and work W are in contact with each other. In this state, the cameras 102 are moved to the positions to be picked up by means of a driving portion (not shown), and then the positions of the work mark Wm of the work W and the mask mark Mm of the mask M are picked up.

As shown in FIG. 8 and FIG. 6(b) by an ideal line, in the case where the mask mark Mm is placed inside of the work mark Wm (basic step), the center positions of both marks are calculated by the control mechanism 107, and on the basis of the amount of the shear in the position, the distance of the work W to be moved is calculated. Then, the vacuum adhering between the mask and the work W is released, the mounting table 108 descends, and the moving mechanism 111 of the mounting table 108 is driven on the basis of the control signal output form the control mechanism 107. This moves the work W to the position appropriate for exposure as shown in FIG. 7(d) to complete the alignment operation.

In the case where the mask mark Mm is placed so that the mask mark overlaps with the boundary of the work mark Wm as shown in FIG. 8 and FIG. 6(b), (applied step), since the image recognized at the side of the control mechanism 107 is in the state where the portion projected from of the boundary of the work to the inside of the work mark is recognized as the shape unified with the work mark Mm, the mask mark cannot be recognized. Consequently, the operation for adequately recognizing the mask mark and the work mark is carried out according to the following procedure:

First, an address coordinates 115 each having 101 picture element units, as the X-axis and the Y-axis is previously set in the picked up image. Using this address coordinates, the positions of the address coordinates $(X_1, Y_1)$, $(X_2, Y_1)$, $(X_1, Y_2)$, and $(X_2, Y_2)$ residing at the outermost positions of the work mark Mw are specified from the shape of the portion of the work mark Wm, which can recognized, among the addresses sectioned by the respective picture elements. Although one side of the circumscribed rectangle 116, which has a portion overlapping with the mask mark Mm, cannot be recognized from the image having been picked up, it can be specified from the fact that the size of half of another side of the circumscribed rectangle 116 can be calculated.

As shown in FIG. 6(c), when the circumscribed rectangle 116 is specified, the inscribed circle 117, which is in contact with insides of the circumscribed rectangle 116 is then set. At this time, the center position $(X_O, Y_O)$ of the inscribed circle 117 and the radius, R, thereof are calculated from the following equations:

$$X_0=(X_1+X_2)/2 \quad (1)$$

$$Y_0=(Y_1+Y_2)/2 \quad (2),$$

$$R=\{(X_2-X_1+1)+(Y_2-Y_1+1)\}/4 \quad (3)$$

The reason why 1 is added to the column of X and Y is as follows:
Due to the address sectioned by the vertical and horizontal picture elements, for example, when $X_1$ is 3 and $X_2$ is 4, the width of the image is 2, and thus, the appropriate size cannot be specified as long as 1 is added in the equation. The values calculated from respective equations are calculated as the length. For this reason, even if the value contains a decimal place, e.g., 0.5, the value can be adequately calculated.

The inscribed circle 117 is recognized as it is perfectly accorded with the work mark Wm or at the position substantially the same as the position of the work mark Wm. For this reason, once the inscribed circle 117 is specified, the inscribed circle 177 is recognized as the work mark Wm as shown in FIG. 7(a). As shown in FIG. 7(b), then, from the boundary of the inscribed circle 117 Wm, the work mark Wm and the sectioned shape Bm of the mask mark Mm, which are recognized inside of the work mark Wm can be recognized. For this reason, the center position of the sectioned shape Bm of the mask mark Mm and the center position of the inscribed circle 117 are calculated and, then the amount of the shear in both central positions is calculated, Furthermore, as shown in FIG. 7(c) and FIG. 7(d), when the alignment operation of the sectioned shape Bm and the inscribed circle 117 (work mark Wm) is carried out, the mask mark Mm is positioned within a range which can be recognized within the inside of the work mark Wm. Consequently, since these marks Wm and Mm picked up by the cameras 102 can be recognized, the center positions Wc and Mc of both marks Wm and Mm can be calculated, and the amount of the shears in the center positions Wc and Mc can also be calculated. Subsequently, the amount of the shear in the positions of the marks is calculated on the basis of the center positions of the marks Wm and Mm, and based of this amount, the moving means 111 is actuated to move the work W to thereby carry out the alignment of both marks Wm and Mm.

Also it is possible to carry out the alignment by repeating the operation described above even in the case where the diameter of the mask mark Mm is similar to that of the work mark Wm. Furthermore, in the case where the diameter of the mask mark Mm formed in less than the diameter of the work mark Wm, the alignment can be completed by carrying out alignment operations twice (first operation concerning the alignment of the inscribed circle 117 and the sectioned shape Bm, and the second alignment concerning the alignment of both marks Wm and Mm).

In the case where the operations shown in FIG. 7(a) through FIG. 7(d), when the inscribed circle 117 is calculated, the calculated inscribed circle 117 may be recognized to carry out the alignment operations. Furthermore, in the case where the operations shown in FIG. 7(c) through FIG. 7(f), the inscribed circle 117 specified by the calculation may be used to carry out the operation. While the moving mechanism 111 for carrying out the alignment of both marks Wm and Mm in the alignment operation described above is composed of moving the work M in this embodiment, it is of course possible to configure the moving mechanism 111 so as to move the mask M supported on the mask frame MF as shown in FIG. 6 by the ideal line by means of the moving means 110.

Furthermore, as shown in FIG. 9(a), the work mark Wm may have any other shape such as circle. To be specific, in the case where the mask mark Mm cannot be recognized due to overlapping the mask mark Mm with the circular work mark Wm, the circumscribed rectangle 126, which circumscribes the inner circle of the work mark Wm is calculated from the X-axis and Y-axis of the coordinates. Subsequently, the inscribed circle 127 which inscribes the circumscribed rectangle 126 is found according to the following equations:
Center position $(X_O, Y_O)$ $$X_0=(X_1+X_2)/2 \quad (1)$$

$$Y_0=(Y_1+Y_2)/2 \quad (2)$$

Radius R $$R=\{(X_2-X_1+1)+(Y_2-Y_1+1)\}/4 \quad (3)$$

As shown in FIG. 9(b), by specifying the inscribed circle 127, the sectioned shape Bm which is sectioned by the inscribed circle is recognized. Subsequently, the center position of the inscribed circle and the center position are calculated, and the amount of the shear in these positions is then calculated to carry out the alignment operation of the inscribed circle 127 and the sectioned shape Bm. By carrying out the alignment operation of the inscribed circle 127 and the sectioned shape Bm as described above, both marks Wm and Mm are positioned at which these marks Wm and Mm can be recognized. Accordingly, the center position of these marks Wm and Mm can be calculated and the amount of the shear in the position can be then calculated to carry out the alignment operation.

There are the cases where the alignment mechanism 101 is placed at the same position as the position of the previous alignment stage and the where it is placed at the position different from the position of the previous alignment stage. In both cases, by carrying out the alignment operation described above, an adequate alignment operation of the mask mark Mm and the work mark Wm can be carried out.

Furthermore, although the embodiment that the work and the mask are picked up by the cameras in the state they are in contact with each other has been described, the present invention is not restricted thereto. For example, the embodiment that the work and the mask are picked up by the cameras in the state where they are closely in contact with each other but not in contact is, of course, within the scope of the present invention.

In this embodiment, the recognition of the work mark is carried out by specifying the circumscribed rectangle and the inscribed circle, it is also possible that in the case of specifying the inscribed circle, the work mark is recognized from the circumference of the work mark without specifying the inscribed circle.

The work applicable to the present invention may be a roll to roll state, and the present invention can also be applied to the alignment of the flexible substrates, liquid crystal substrates, semiconductor wafers, and other works. The work in which the alignment of both sides is required is also applicable to the present invention. Moreover, the mask may be a mask film or a glass substrate.

The alignment manner of the work and the mask shown in the figures is horizontal state. However, the present invention is not restricted thereto, for example, the alignment applicable to the present invention can be carried out in the vertical direction, a slanted direction.

In the case of specifying the circumscribed rectangle, the circumscribed rectangle is not always recognized as a square. In such a case, the circumscribed rectangle recognized is calculated as a square on the basis of the predetermined amendment data. Alternatively, in the case where the circumscribed rectangle is recognized as a rectangle, which is not a square, the inscribed circle is calculated and recognized as a true circle on the basis of the predetermined amendment data.

In another embodiment of the present invention, if the work mark or the mask mark has an oval shape, both marks are separated by the oval, which inscribes the circumscribed rectangle to carry out the alignment operation. To be specific, the center $(X_0, Y_0)$ of the inscribed oval and the long axis radius $(R_x)$ and the short axis radius $(R_y)$ of the oval can be calculated according to the following equations:

$$X_0=(X_1+X_2)/2 \quad (4)$$

$$Y_0=(Y_1+Y_2)/2 \quad (5)$$

$$R_x=(X_2-X_1+1)/2 \quad (6)$$

$$R_y=(Y_2-Y_1+1)/2 \quad (7)$$

Furthermore, even if the work mark and the mask mark are rectangles, both marks are separated by the circumscribed rectangle, the circumscribed rectangle and the sectioned shape sectioned by the specified circumscribed rectangle can be aligned, and both marks can then be aligned to carry out the alignment operation.

Even if the shapes of the work mark and the mask mark are circles, ovals, rectangles, or any other complicated shapes, by memorizing the shapes in the control mechanism, one marks which has been memorized is inserted into the position which recognizes one mark, and another mark is separately recognized to carry out the alignment operation.

As the moving means for moving the work or the mask, an X, Y, θ alignment table (front and back on the plane, right, revolution) can be used instead of the three points locater.

The embodiment of the alignment mechanism that the work mark of the mark is assumed as outside one mark residing, and the mark of the mask is assumed as inside another mark has been described. However, the embodiments that the mask mark may be inside one mark and the work mark may be outside another mark is also within the scope of the present invention. Consequently, the alignment can be carried out even if the work mark is inside and the mask mark is outside or vice versa.

Furthermore, the configuration of the coordinates that one picture element used as units of the X-axis and the Y-axis has been described, the length may also be used as the value of the X-axis and the Y-axis to calculate the circumscribed rectangle and to find the inscribed circle which inscribes the circumscribed rectangle. In this case, the calculation is carried out by omitting the (+1) to be added to X or Y.

As described above, the second embodiment of the present invention has the following advantages:

According to the alignment mechanism of the present invention in which even if the work mark and the mask mark are overlapped with each other on the boundary of one mark, one mark is sectioned from another mark, the sectioned shape and another mark aligned, and then alignment of both marks is carried out, the alignment operation can be carried out in a reliable manner without any trouble by carrying out the previous alignment.

According to the alignment mechanism of the present invention in which if the work mark and the mask mark are overlapped with each other on the boundary of one mark, the circumscribed rectangle of one mark is set, the inscribed circle which inscribes the circumscribed rectangle is specified, another mark is sectioned by the inscribed circle, the alignment of the inscribed circle and the sectioned shape is carried out, and then alignment of both marks is carried out, the alignment operation can be availably carried out.

According to the alignment mechanism of the present invention in which if the work mark and the mask mark are overlapped with each other on the boundary of one mark, the circumscribed rectangle and the inscribed circle which inscribes the circumscribed rectangle of one mark are set by the coordinates and the given equations, another mark is sectioned by the inscribed circle to recognize it, the alignment of the inscribed circle and the sectioned shape is carried out, and then alignment of both marks is carried out, the alignment operation can be availably carried out.

Furthermore, in spite of the shape of the mark, i.e., in the case where either or both of the mask mark and the work mark have a shape like a circle, the alignment operation can be availably carried out even if the mask mark or the work mark cannot be recognized.

If the work mark is overlapped with the mask mark and, thus it cannot be recognized, by specifying the mark which cannot be recognized from the circumference of one mark which can be recognized, the alignment procedure can be carried out more quickly.

(Third Embodiment)

A third embodiment of the present invention will now be described by referring to the drawings.

Figure 10:
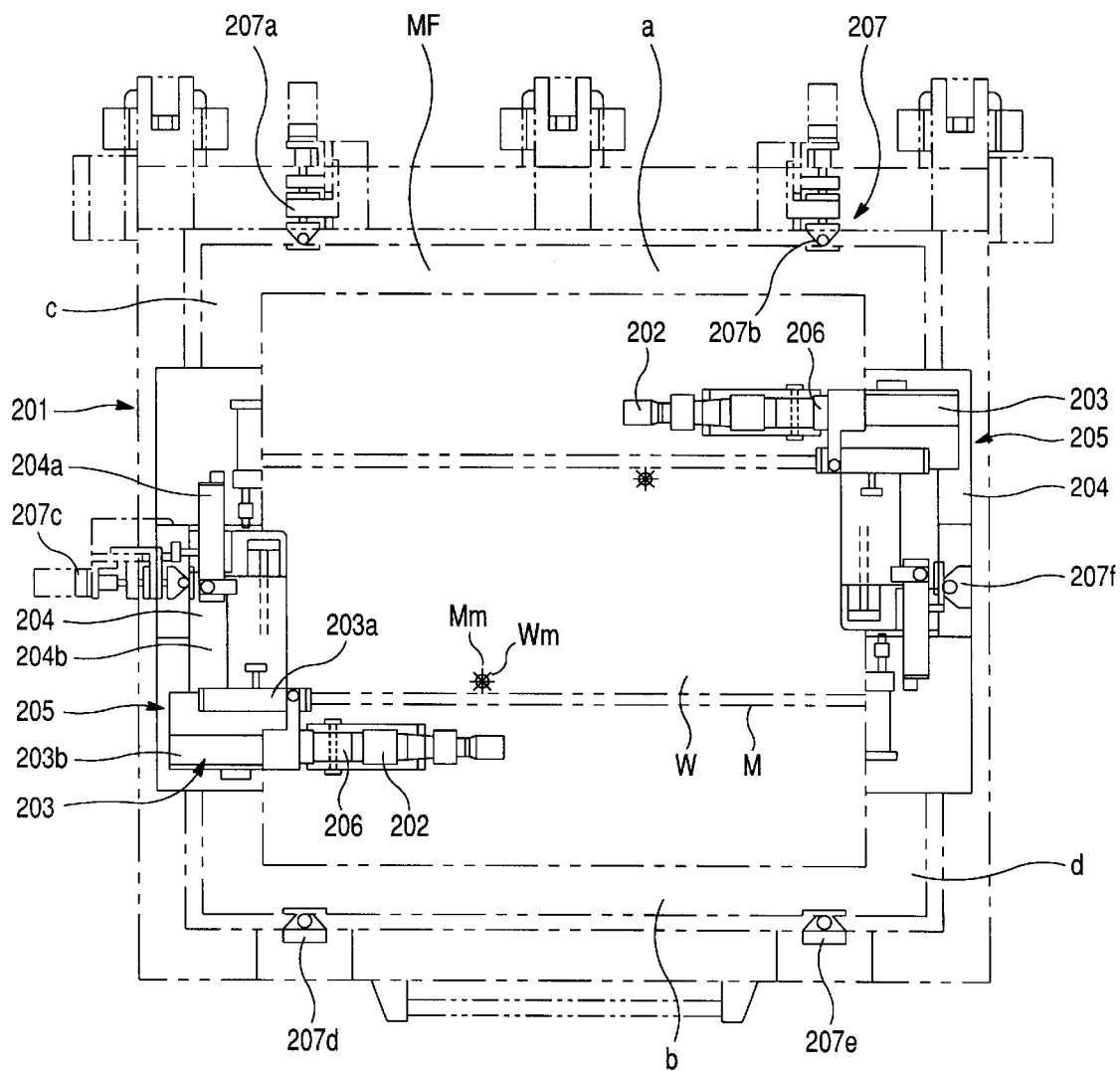
FIG. 10 is a plane view showing the main portions of the alignment mechanism according to another embodiment of the present invention.

FIG. 10 is a plane view showing the main portions of the alignment mechanism according to another embodiment of the present invention. FIG. 11 is a plane view showing the main portions of the alignment mechanism according to still another embodiment of the present invention. FIG. 12(*a*) is a principal drawing totally showing the alignment mechanism according to still another embodiment of the present invention. FIG. 12(*b*) and FIG. 12(*c*) are plane views each showing the situation where another shape of the work mark and another shape of the mask mark are picked up by the camera.

As shown in FIG. 10 through FIG. 12, the alignment mechanism 201 of the third embodiment of the present invention is composed of camera 202, typically CCD camera, which picks up a mask mark Mm of the mask M and a work mark Wm of the work W, a moving mechanism 205, which supports the camera 202 in a movable manner, a supporting frame MF, which supports the moving mechanism 205, residing at the supporting base side, a mounting table 208, which mounts and supports the work W, moving means 207 which pushes up the mask supporting frame MF, a control mechanism 210, which recognizes, calculates and memorizes the images picked up by the cameras 202, and which controls the movement of the moving means 207 based on the results of the calculation, and optional illumination lamps 209 and 209 for illuminating the picked up images. The mask M possesses a prescribed pattern, for example, a circuit pattern in the case where the work W is a printed board. A mounting table 8 adheres and holds the work W at the mounting position.

The camera 202 is supported by the moving mechanism 202 via a mounting arm 206. The moving mechanism 205 is composed of two moving mechanisms, i.e., a first moving mechanism 203 and a second moving mechanism 204. The first moving mechanism 203 possesses a driving portion 203a, a guide rail 203b, a position sensor (not shown) and the like. The camera by means of the first moving mechanism 203 can be moved from left and right or vice versa (X direction) at a prescribed distance.

The first moving mechanism 203 is supported by the second moving mechanism 204 in a movable manner. The second moving mechanism 204 is a driving portion 204a for moving all of the first moving mechanism 203, a guide rail 204b, and a position sensor (not shown). The second moving mechanism moves the cameras 202 and 202 to the direction (Y-direction) perpendicular to the direction of moving the first moving mechanism at a prescribed distance.

As shown in FIG. 11 by an ideal line, the cameras 202 and 202 are composed so that the side of the edges of the mounting arms 206 and 206 are driven in a rotatable manner, and the cameras 202 and 202 are rotated if required.

The control mechanism 210 has a central processing unit 211, which recognizes the images picked up by the cameras 202 and 202 and calculates them according to a prescribed calculation, a ROM 212, which memorizes the calculation programs making a calculation in the central processing unit, a RAM 213 having functions such as storing the results of the calculation calculated by the central processing unit 211, and input and output data, as well as reading data and programs, and optionally an external storage device 214.

On the other hand, the moving means 207 is to move the mask supporting frame MF. As shown in FIG. 10, the moving means 207 is composed of driving push portions 207a and 207b provided so as to push up one side a of the mask supporting frame MF, an accompanying push portions 207d and 207e which are placed at one side c of the mask supporting frame MF opposite the driving push portions 207a and 207b, a driving push portion 207c which is set so as to push up the center of one side c of the mask supporting frame MF, and a accompanying push portion 207f which is placed at one side d of the mask supporting frame opposite the driving push portion 207c. The mask supporting frame MF is composed so as to be movable in the rotation direction of front, back, left and right in a horizontal plane via a supporting means (not shown) such as a plunger having a rotatable ball at the edge thereof.

In the embodiment as shown in FIG. 10 and FIG. 11, the work W has a shape of a long sheet (roll to roll), the mounting table 208 positioned at the lower side of the work W moves vertically at a prescribed distance so that the work W is in contact with the mask or the work W is separated from the mask M. When the cameras 201 and 201 pick up the work W and the mask M which are in contact with each other, a suction mechanism (not shown) placed at the mounting table side is suctioned in vacuo so as to make the work W and the mask M in contact with each other.

Figure 13A:
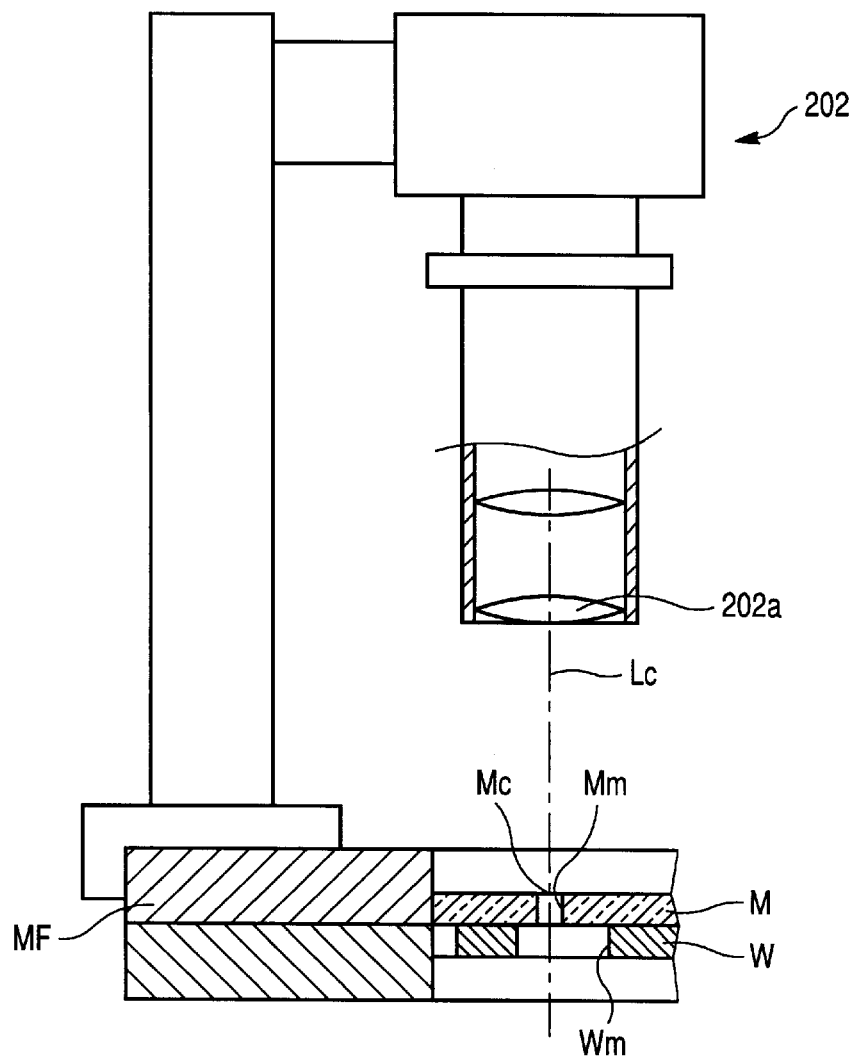
FIG. 13(a) is a principal cross-sectional drawing totally showing the alignment mechanism according to still another embodiment of the present invention.
Figure 13B:
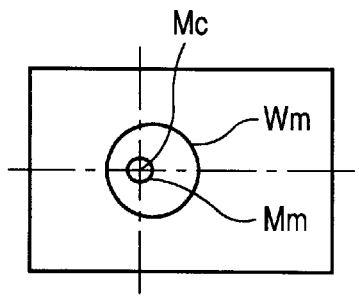
FIG. 13(b) is a plane view showing the situation where another shape of the work mark and another shape of the mask mark are picked up by the camera.

As shown in FIG. 13, when the moving mechanism 205 moves the cameras 202 and 202, the control mechanism has previously programmed the position which align the center position Mc of the mask mark M to be picked up and the center focus Lc of the lens or lens system 202a to be used in the cameras 202 and 202 as the standard position in the case of the movement.

Consequently, when the alignment of the work mark Wm and the mask mark Mm, the alignment mechanism according to this embodiment of the present invention has the following functions.

First, as shown in FIG. 10 and FIG. 11, when the work W is transferred onto the mounting table 208, and is stopped in the vicinity of the mask mark Mm, the mounting table 208 ascends to allow the work W to come into contact with the mask M, and they are adhered to each other by means of a vacuum suction mechanism (not shown).

Subsequently, when the work W and the mask M are adhered to each other by means of a vacuum suction mechanism, the cameras 202 and 202 are moved to the position where the work mark Wm and the mask mark Mm are within the display to be picked up by the actuation of the first and second moving mechanisms 203 and 204. At this time, as shown in FIG. 13, since the center focus Lc of the lens or lens system 202a to be used in the cameras 202 and 202 is set as the standard position in the case of the movement as described above, the moving mechanism 205 moves so as to move the cameras 202 and 202 to the standard position of the movement.

When the cameras 202 and 202 are moved, as shown in FIG. 12(b), the display images picked up by the cameras 202 and 202 are converted into binary data whereby the control mechanism 210 recognizes both marks Wm and Mm, calculates the amount of the shear in the center positions of both marks Wm and Mm, and calculates the distance of moving the mask M from the calculated amount of the shear. Subsequently, the vacuum adhesion between the work W and mask M is released and the mounting table 208 descends, after which the mask supporting frame MF is pushed up to the position of the adequate exposure via the moving means 207 (X, Y, θ driving) on the basis of the control signal output from the control mechanism 210. When the mask supporting frame MF is moved, the center focus Lc of the lens or lens system 202a to be used in the cameras 202 and 202 and the center position Mc of the mask mark Mm are fixed. For this reason, The situation is shifted from one which is shown in FIG. 12(b) to one which is shown in FIG. 12(c), the alignment operation is always carried out at center focus Lc of the lens or lens system 202a to be used in the cameras 202 and 202. This makes it possible to applicable the alignment on the several microns or several tens microns order.

After the alignment operation has been completed, the cameras 202 and 202, whether or not the alignment is within the allowable level, again carry out the confirmation operation. When it is confirmed by this confirmation operation that the mask is required to be further moved, the control signal based upon the calculated amount of the shear in the positions is transferred from the control mechanism 210 to the side of the moving means 207 of the mask supporting frame MF to carry out the alignment operation.

The first and second moving mechanisms 203 and 204, which support the cameras 202 and 202 in a movable manner are placed on the mask supporting frame MF at the side of the supporting base and, thus, they never have any adverse influence upon the heat generated by the vibration or actuation at the body side or radiating heat from the light exposure operation.

In another embodiment of the alignment mechanism 201 of the present invention, the first and second moving mechanisms 203 and 204, which support the cameras 202 and 202 in a movable manner are placed at the supporting base. When the first and second moving mechanisms 203 and 204 are placed at the supporting base, the center position (see FIG. 13) of the mask mark Mm after the aligned in the alignment operation just carried out has been memorized by the RAM 212 at the control mechanism side or the external storage device 214, and the position which aligns the memorized center position Mc of the mask mark Mm and the center focus Lc of the lens or lens system 202*a* of the camera 202 may be utilized as the standard position of the movement of both moving mechanism 203 and 204. Consequently, when the cameras 202 and 202 pick up both marks Wm and Mm, the center position Mc of the mask mark Mm can be recognized at the center focus Lc of lens or lens system 202*a* of the camera 202.

While the work sheet W having a long sheet shape has been described in this embodiment, the present invention is applicable to printed circuit substrates, semiconductor substrates, liquid crystal substrates, and any other cut sheets. With regard to the mask M, while the embodiment that the mask film is adhered on the mask supporting frame MF, the mask glass may also be utilized.

In the alignment mechanism of the present invention, when the work mark is large and the mask mark is small, the position which aligns the memorized center position of the mask mark and the center focus of the lens or lens system of the camera may be utilized as the standard position of the movement of both moving mechanism.

Furthermore, while the embodiment shown in the figures that the alignment operation is carried out in the horizontal direction has been described, the operation may be adequately carried out in the vertical direction or a slanted direction.

As described above, the present invention has the following outstanding advantages:

The alignment mechanism having a moving mechanism which moves a camera can suppress the adverse influence upon the vibration and heat in comparison with the alignment mechanism having the moving base on the body of the alignment mechanism, and thus, it can be used as the alignment in which the precision on the order of several microns to several tens microns is required can be advantageously carried out.

What is claimed is:

1. A process for aligning a work and a mask by positioning a mask mark relative to a work mark to align an amount of the relative offset in the positions of the marks of the work and the mask, which comprises:

a first step identifying a first image of the work mark and a second image of a mask mark of the mask having a pattern and which is brought into contact with the work, a second step for calculating an amount of relative offset in the position of said first image and said second image, and aligning the work and mask by a moving means to an appropriate aligned position based on the calculated amount of the relative offset in the positions of said first image and said second image, and a third step for memorizing the aligned position of the second image of said mask mark, said second step including:

a preliminary step of calculating the amount of the relative offset in the positions of both said work and said mask marks and aligning both marks by moving the work and the mask, in the case where both said first image and said second image can be recognized, and a back-up step, in the case where said position of at least one of said work mark and said mask mark to be aligned cannot be recognized, for calculating the amount of relative offset in the positions of both marks based on the aligned position of the second image of said mask mark memorized in the previous operation as a memorized standard, and aligning the work and the mark by moving them based on the amount of the shear calculated in the case where said position of at least one of said first image of said work mark and said second image of said mask mark to be aligned cannot be recognized.

2. A process for aligning a work and a mask by positioning a work mark relative to a mask mark to align an amount of the relative offset in the positions of the work mark and the mask mark, which comprises:

a first step identifying a first image of the work mark and a second image of a mask mark of the mask having a pattern and which is brought into contact with the work, a second step for calculating an amount of relative offset in positions of said first image and said second image, and aligning the work and mask by a moving means to an appropriate aligned position based on the calculated amount of the relative offset in the positions of said first image and said second image, and a third step for memorizing the aligned position of the first image of said work mark, said second step including:

a preliminary step of calculating the amount of the relative offset in the positions of both said work and said mask marks and aligning both marks by moving the work and the mask, in the case where both said first image and said second image can be recognized, and a back-up step, in the case where said position of at least one of said work mark and said mask mark to be aligned cannot be recognized, for calculating the amount of relative offset in the positions of both marks based on the aligned position of the second image of said work mark memorized in the previous operation as a memorized standard, and aligning the work and the mark by moving them based on the amount of the shear calculated, in the case where said position of at least one of said first image of said work mark and said second image of said mask mark to be aligned cannot be recognized.

3. A process for aligning a work mark and an mask mark by placing one of both marks relative to the other mark to align an amount of relative offset of said marks, which comprises:

a first step, in the case where a camera cannot recognized appropriately both said work mark and said mask mark due to the overlapping of one mark with a boundary of another mark by means of the alignment mechanism, for calculating a circumscribed rectangle that circumscribes said one mark, a second step for calculating and recognizing an inscribed circle which inscribes said circumscribed rectangle, a third step for calculating a center position of said inscribed circle and an amount of relative offset of the position with the center of a sectioned shape of the another mark sectioned by the boundary of said inscribed circle, a fourth step for operating an alignment based on the calculated amount of the relative offset in the position with the center of the sectioned shape of said another mark, and a fifth step for recognizing both marks, and calculating an amount of the relative offset in the center positions of both marks to operate and control the alignment.

4. A process for aligning a work mark and a mask mark by aligning one of both marks with respect to another mark to align an amount of a relative offset in the positions of the work mark and the mask mark, which comprises:

a first step, in the case where both marks picked up by a camera cannot be recognized appropriately due to an overlapping of one mark with a boundary of another mark by means of an alignment mechanism, for finding an apex coordinate residing at a diagonal line of a circumscribed rectangle based on a preset coordinate from a portion which can be recognized, a second step for finding a center position defined by the coordinates Xo and Yo of an inscribed circle which inscribes said circumscribed rectangle from the following equations:

$$Xo=(X1+X2)/2 \qquad (1)$$

$$Yo=(Y1+Y2)/2 \qquad (2),$$

where X1 and Y1 define a first corner of said circumscribed rectangle and X2 and Y2 define a second corner of said circumscribed rectangle;

and also finding a radius R of said inscribed circle from the following equation to recognize said inscribed circle:

$$R=\{(X2-X1+1)+(Y2-Y1+1)\}/4 \qquad (3)$$

a third step for calculating a center position of said inscribed circle and an amount of the relative offset in the position with the center of a sectioned shape of said one mark sectioned by the boundary of said inscribed circle, a fourth step for operating an alignment based on the calculated amount of the relative offset in the position with the center of the sectioned shape of said one mark, and a fifth step for recognizing both marks, and calculating an amount of the relative offset in the center positions of both marks to operate the alignment.

5. A process for aligning a work mark and a mask mark by placing one of both marks within another mark to align an amount of a shear in the position, which comprises:

a first step for picking up a work mark of the work placed on a mounting table and a mask mark of the mask, and recognizing positions of both marks by a control mechanism, a second step for calculating a relative offset in the positions of both marks and aligning the work and mask by a moving means to an appropriate exposure position based on the calculated amount of the relative offset in the both marks, said second step including a preliminary step of calculating the amount of the relative offset of the positions of both said work and said mask marks and aligning both said marks by moving one of said work and mask marks in the case where both marks can be recognized appropriately by means of said control mechanism, an applied step, in the case where both marks cannot be recognized appropriately by means of said control mechanism, for calculating a circumscribed rectangle which circumscribes one mark from a shape of a part which can be recognized, and an inscribed circle thereof which is recognized as the one mark, aligning the center of said one mark to the center position of a sectioned shape of the another mark sectioned by the boundary of said one mark, subsequently, recognizing both marks and aligning both marks based on an amount of relative offset in the positions calculated from the center positions of both marks.

* * * * *